(12) United States Patent (10) Patent No.: US 7,017,081 B2
Gomez (45) Date of Patent: Mar. 21, 2006

(54) METHODS AND SYSTEMS FOR REMOTELY CONTROLLING A TEST ACCESS PORT OF A TARGET DEVICE

(75) Inventor: Joseph Jonas Gomez, Aurora, IL (US)

(73) Assignee: Lucent Technologies Inc., Murray Hill, NJ (US)

( * ) Notice: Subject to any disclaimer, the term of this patent is extended or adjusted under 35 U.S.C. 154(b) by 564 days.

(21) Appl. No.: 10/259,111

(22) Filed: Sep. 27, 2002

(65) Prior Publication Data

US 2004/0064764 A1    Apr. 1, 2004

(51) Int. Cl.
*G06F 11/00*    (2006.01)
(52) U.S. Cl. ........................................ 714/30
(58) Field of Classification Search .................. 714/30
See application file for complete search history.

(56) References Cited

U.S. PATENT DOCUMENTS

| 6,393,591 B1 | 5/2002 | Jenkins, IV et al. | |
| 6,807,644 B1 * | 10/2004 | Reis et al. | 714/724 |
| 2003/0131136 A1 * | 7/2003 | Emerson et al. | 709/250 |
| 2003/0140291 A1 * | 7/2003 | Brown et al. | 714/724 |
| 2003/0212932 A1 * | 11/2003 | Sauber et al. | 714/712 |

OTHER PUBLICATIONS

Website pages from http://www.blueiguana.com (2 pages) (printed Jun. 12, 2002).

Informational leaflet from Blue Iguana Networks, *Blue Iguana™ Developer's System BGN 62100*, 2 pages.
Website pages from Exilinx Online Upgradable Systems, goahead software, Version 1.3, Feb. 1, 2000, 10 pages.
Login Harris, et al., "FPGAs don remote reprogram habits," EE Times, Feb. 16, 2001, 4 pages.
William Dowel, "Prepping System Designs for Remote Connectivity," Electronic Engineering Design, Jan. 3, 2002, 5 pages.
Website pages from http://www.sanpeople.com (2 pages) (printed May 21, 2002).
Website pages from http://www.chipcenter.com (2 pages) (printed May 21, 2002).

* cited by examiner

*Primary Examiner*—Scott Baderman
*Assistant Examiner*—Joshua Lohn

(57) ABSTRACT

JTAG operations are carried out remotely over a network interface. The host processor includes a JTAG interpreter and a host side JTAG driver. A target device includes a target side JTAG driver. The interpreter processes and translates JTAG design files. The host side JTAG driver generates messages for the target side JTAG driver based on the translation. The host JTAG driver delivers the messages to a host network interface. The host network interface is connected via a network link to a target network interface. The target network interface is connected to the target side JTAG driver. The target side JTAG driver communicates with a target boundary scan chain. The target side JTAG driver and host side JTAG driver communicate over the network link. Network overhead is reduced by buffering messages until a message requiring a return of test data is ready for transmission.

27 Claims, 10 Drawing Sheets

*FIG. 7 (cont. a)*
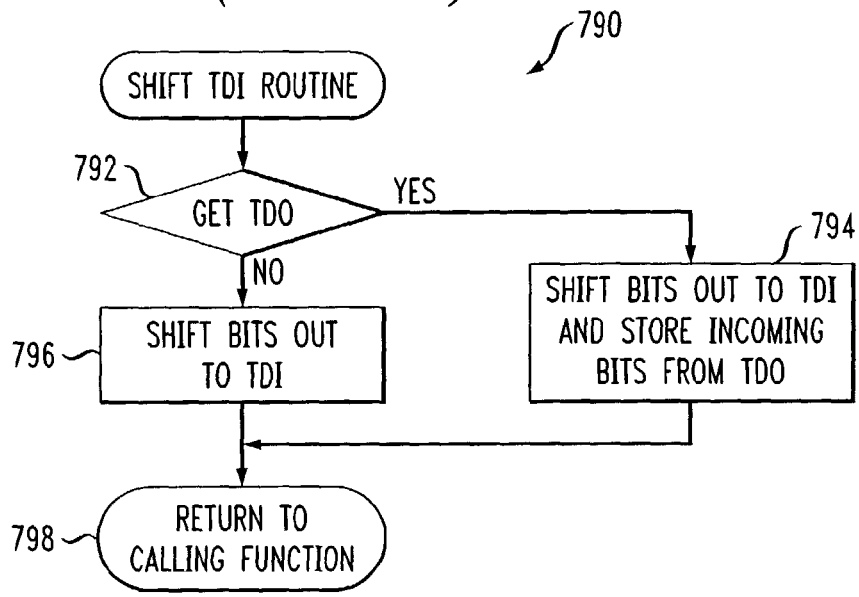
*FIG. 7 (cont. b)*
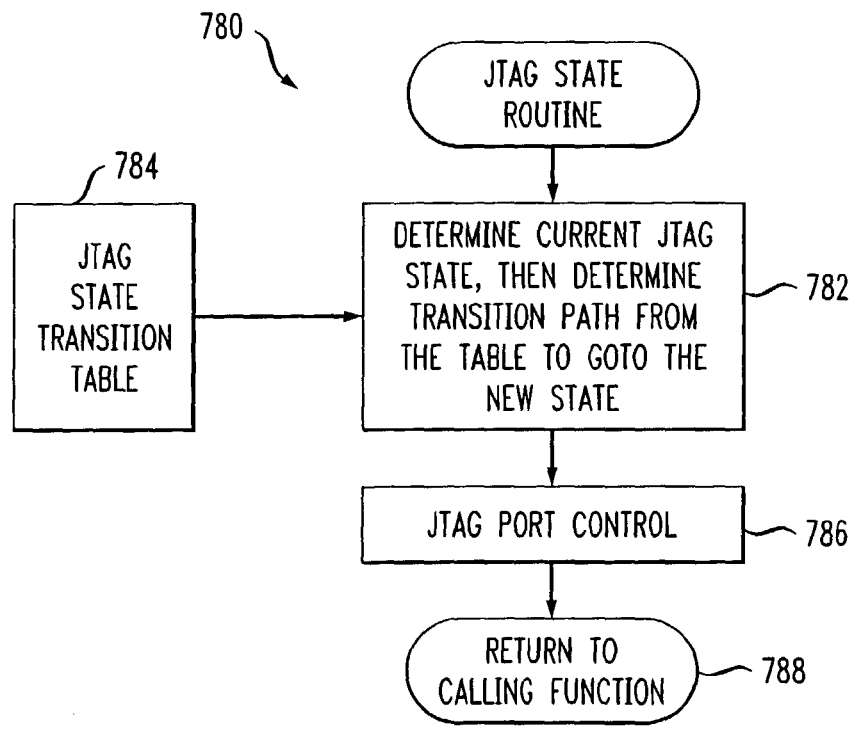

METHODS AND SYSTEMS FOR REMOTELY CONTROLLING A TEST ACCESS PORT OF A TARGET DEVICE

FIELD OF THE INVENTION

The invention is directed to a method and system for remotely configuring and testing electronic hardware via an IEEE 1149.1 test access port associated with the electronic hardware.

BACKGROUND OF THE INVENTION

The IEEE 1149.1 test access port (TAP) and boundary scan architecture, which is commonly referred to as JTAG, is a popular testing and device programming scheme. JTAG is an acronym standing for the Joint Test Action Group, which is a technical subcommittee that was initially responsible for developing the standard. Many electronic devices are available that comply with the IEEE 1149.1 standard. For example, many Field Programmable Gate Arrays (FPGA), Complex Programmable Logic Devices (CPLD) and memory devices such as Flash and other EEPROM devices include a JTAG Test Access Port (TAP) and can be programmed, configured, tested and verified through the port. Furthermore, the boundary scan architecture provides for the testing of interconnections between two or more JTAG compatible devices. Therefore, the JTAG or IEEE 1149.1 standard provides a means to ensure the integrity of individual board level components as well as board level interconnections. Boundary scan tests are commonly used to detect opens and shorts at both the board and individual device level, thereby reducing the need for expensive bed-of-nails testing.

The standard requires that a Test Access Port support at least a set of four signals. The signals are named Test Data In (TDI), Test Data Out (TDO), Test Mode Select (TMS), and Test Clock (TCK). Optionally, a Test Reset Signal (TRST) may also be supported. Referring to FIG. 1, generally a piece of illustrative electronic JTAG compliant hardware 110 includes a plurality of JTAG compliant devices 114. TDO and TDI pins of the devices are interconnected in a boundary scan chain 118. The electronic hardware 110 includes a board level Test Access Port 122. The board level Test Access Port 122 is connected to the Test Access Ports of the individual devices 114. A JTAG source 126 is shown connected to the board level JTAG port. For example, the JTAG source 126 is a piece of Automatic Test Equipment (ATE) used in the manufacturing process, a personal computer, or some other specialized piece of hardware adapted to manipulate and control the TAP signals. Because the Test Data In (TDI) and the Test Data Out (TDO) pins of the JTAG compliant devices are connected in the boundary scan chain 118, the JTAG source can send commands to and receive results from each of the JTAG compliant devices 114. Therefore, a JTAG source can program, configure, verify or test a plurality of JTAG compliant devices at once.

More specifically, a piece of JTAG compliant hardware can include a plurality of specialized devices. The plurality can include both JTAG compliant and non-compliant devices. For instance, a piece of compliant hardware can include a boot processor. A boot processor can configure devices associated with the hardware when the hardware is powered up. For example, the configuration can be based on information stored in a memory device of the electronic hardware. The boot processor can be the main, or only, processor of the electronic device. For instance, a main processor is placed in boot processor mode when the electronic device is powered up. When the boot process is completed, the main processor reverts to a main processor function. Alternatively, the boot processor can be dedicated to the booting function. In this case, a second processor is responsible for the main functions of the electronic device.

Referring to FIG. 2 for purposes of a more detailed illustration, a second piece of JTAG compliant electronic hardware 210 includes a boot processor 214 and a high-speed processor 218. The boot processor includes a JTAG port 222. The boot processor 214 communicates with other devices over a boot bus 226. The high-speed processor 218 communicates with other devices over a high-speed bus 230. A bridge 234 allows the boot processor 214 to communicate with devices on the high-speed bus 230. For example, the boot processor communicates with boot Flash 238, boot RAM 242 and the bridge 234 over the boot bus 226. For instance, the boot Flash 238 and boot RAM 242 might be non-compliant devices.

The high-speed processor 218 communicates with a cache 246 over a cache bus 248. The high-speed processor 218 communicates with a large RAM 250, I/O and status registers 254, peripherals 258 and a Flash/ROM 262 over the high-speed bus 230.

The JTAG port 222 communicates with a boundary scan chain 266 including the bridge 234, the cache 246, the high-speed processor 218, the large RAM 250, the I/O and status registers 254, the Flash/ROM 262, and the peripherals 258.

On power up, the boot processor can read configuration, programming, verification or test information from the boot flash 238. The boot processor 214 controls the JTAG port 222 to communicate with the boundary scan chain 266. The boot processor configures, programs, verifies or tests the devices 234, 246, 218, 250, 254, 258, 262 on the boundary scan chain 266, as directed by the information stored in the boot Flash 238.

Programming, configuring, verifying and testing hardware such as the exemplary hardware of FIG. 1 and FIG. 2 can be expensive.

Referring to FIG. 3, currently there are at least three methods for using JTAG vectors with electronic devices of a piece of electronic hardware 302. In one method, a JTAG source such as Automatic Test Equipment (ATE) 304 is loaded with JTAG vector information. For example, the ATE is loaded with boundary scan test vectors 306 for testing board level interconnections. The boundary scan test vectors are generated by development and test support software running on, for example, a host computer 307. The Automatic Test Equipment 304 is connected to the piece of electronic hardware 302. The connection is either a direct connection to Test Access Port signal lines of the electronic hardware 302 (see 122 of FIG. 1) or an indirect connection through a JTAG access port interface 308. The Automatic Test Equipment 304 manipulates and monitors the Test Access Port signals (TDI, TDO, TMS, TCK and optionally TRST) according to the JTAG vectors, in order to control and monitor the inputs and outputs of electronic devices 310 as a means for testing printed circuit board traces and other device interconnections. Alternatively, or additionally, the ATE 304 can be loaded with programming, configuration, or test vectors 312 and used to program, configure, validate and/or test the devices 310 after they are installed in the electronic hardware 302.

In another method, a device programmer 330 is loaded with JTAG programming, configuration and/or test vector information 312 and used to program electronic devices 314 prior to the installation of the devices 314 in the piece of electronic hardware 302.

In a third method, only a boot EEPROM 334 is programmed by a device programmer 338. The EEPROM 334 is installed in the electronic hardware 302. A boot processor 342 of the electronic hardware 302 has access to the test access port signal lines of JTAG compatible devices (e.g., devices 310) on the electronic hardware 314. The boot processor 342 reads the information stored in the EEPROM 334 and manipulates and monitors the Test Access Port signal lines to program, configure, verify and/or test the JTAG compatible devices and interconnections associated therewith according to the read information.

All of these methods for programming, configuring, verifying and/or testing the electronic hardware 302 and devices 310, 314, 334 associated therewith require the use of expensive and complicated equipment such as the automatic test equipment 304 and device programmers 330, 338. Additionally, the methods require trained technicians to operate the equipment 304, 330, 338, and where necessary, install devices 314, 334. Therefore, these methods can be useful in a product or electronic hardware 314 development environment, where the cost of equipment 304, 330, 338 and technician training can be amortized over a great number of pieces of electronic hardware 302. However, these methods become prohibitively expensive once the electronic hardware 302 has been installed in a customer's site. For example, where an electronic device 302 is installed at a customer's site and requires testing or updating, it can be impractical to send automatic test equipment, device programmers and trained technicians to the customer's site to do the testing or updating.

Therefore, there is a desire for a system and method for programming, configuring, verifying and/or testing a piece of electronic hardware remotely. This remote capability eliminates transportation costs, simplifies scheduling and reduces a number of skilled technicians required to service an installed base of electronic devices.

SUMMARY OF THE INVENTION

A system for remotely controlling a test access port of a target device has been developed. The system includes a network link a host computer and a target device.

The host computer includes a host network interface operative to connect the host computer to the network link, an interpreter operative to translate a design file into commands, and a host driver operative to assemble at least one message based on the commands, deliver the at least one message to the host network interface, receive results from the host network interface, and pass the results received from the host network interface back to the host interpreter.

The target device includes a target network interface operative to connect the target device with the network link, and a target driver operative to receive messages from the target network interface, translate the at least one message into an operation, operate a test port in accordance with the operation, receive results from a device in communication with the port and deliver the results to the target network interface, for transmission to the host network interface.

A method of remotely controlling a test port of target hardware includes providing a target network interface on the target hardware, providing a network link between the target network interface and a host computer, providing a target driver on the target hardware in communication with the target network interface, translating an operation or action into a command in the host computer, assembling a network compatible data packet containing the command, transmitting the network compatible data packet to the target network interface over the network link, reconstructing the command from the network compatible data packet on the target hardware, interpreting the command into an operation, and, the target driver controlling a test access port of the target hardware based on the interpreted boundary scan operation.

The method can further include receiving a result in the target driver from the test port, delivering the result to the target network interface, assembling a network compatible result packet based on the delivered result, transmitting the network compatible data packet to the host over the network link, reconstructing the result from the network compatible result packet, and, processing the result.

An exemplary electronic apparatus or target device operative to take advantage of the system and method includes at least one JTAG compliant device. The electronic device is adapted to allow for the JTAG compliant devices and/or interconnections associated therewith, to be at least one of remotely programmed, configured, verified and tested. The electronic apparatus has a JTAG boundary scan chain including the at least one JTAG compliant device, a network interface operative to receive and transmit JTAG messages over a network, and a JTAG driver operative to receive JTAG messages from the network interface, control the boundary scan chain based on the received JTAG messages, and to deliver boundary scan results to the network interface

BRIEF DESCRIPTION OF THE DRAWINGS

The invention may take form in various components and arrangements of components, and in various procedures and arrangements of procedures. The drawings are not to scale and are only for purposes of illustrating a preferred embodiment and are not to be construed as limiting the invention.

DETAILED DESCRIPTION OF THE INVENTION

Figure 1:
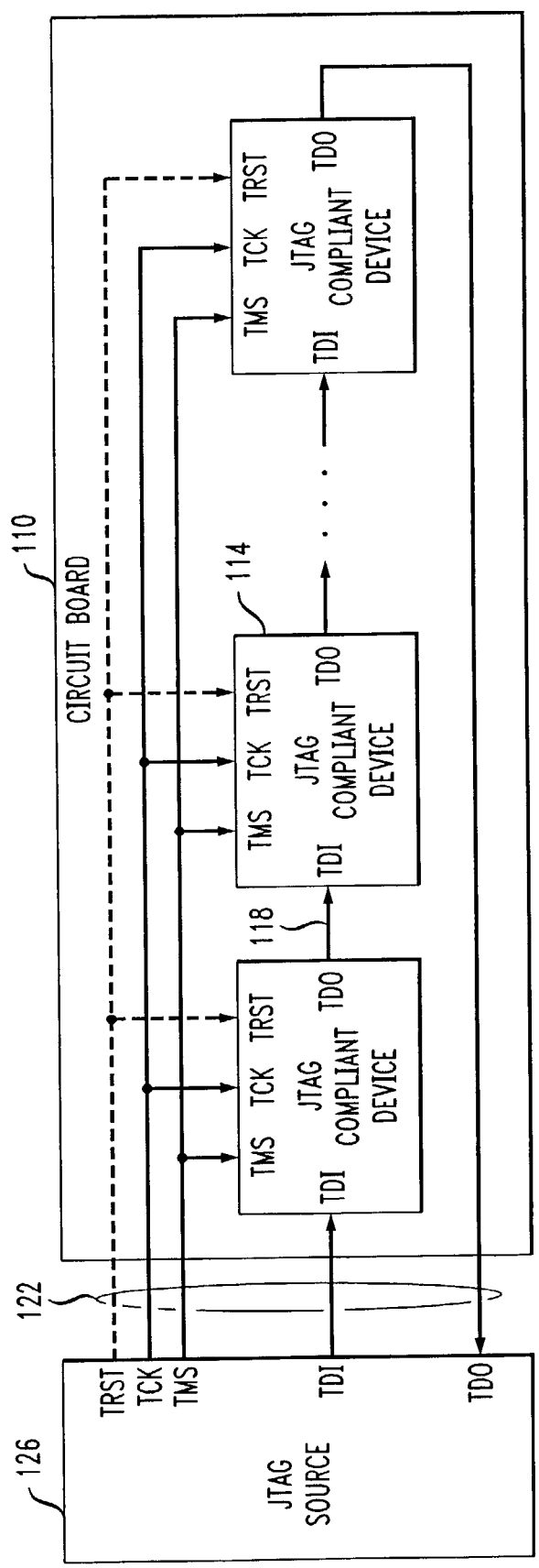
FIG. 1 is a block diagram of a piece of electronic hardware connected to a JTAG source that is local to the electronic hardware.
Figure 2:
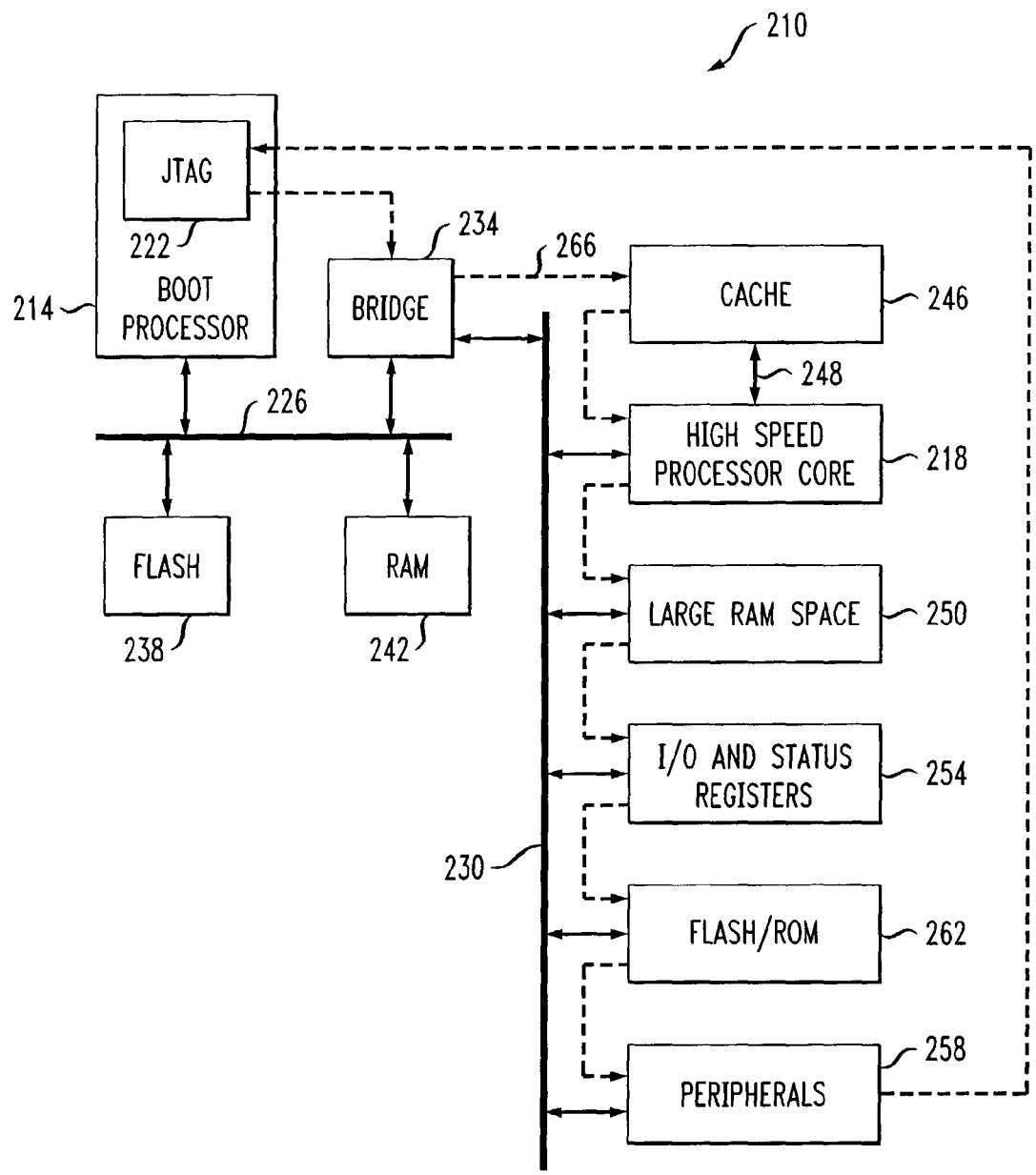
FIG. 2 is a block diagram of a piece of electronic hardware including a boot processor and a JTAG boundary scan chain.
Figure 3:
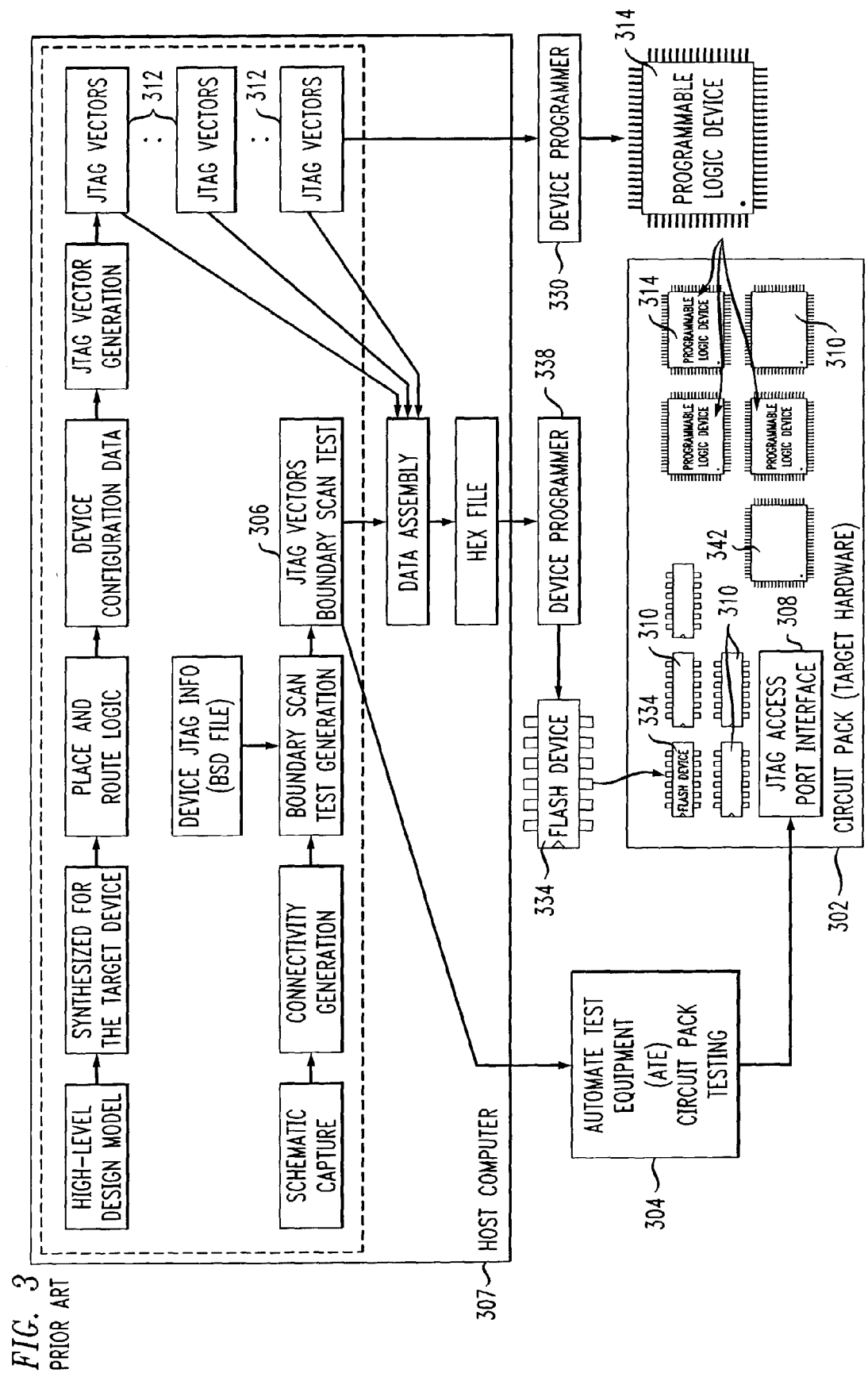
FIG. 3 is a block diagram illustrating several prior art methods for programming, configuring, verifying and testing devices of a piece of electronic hardware.
Figure 4:
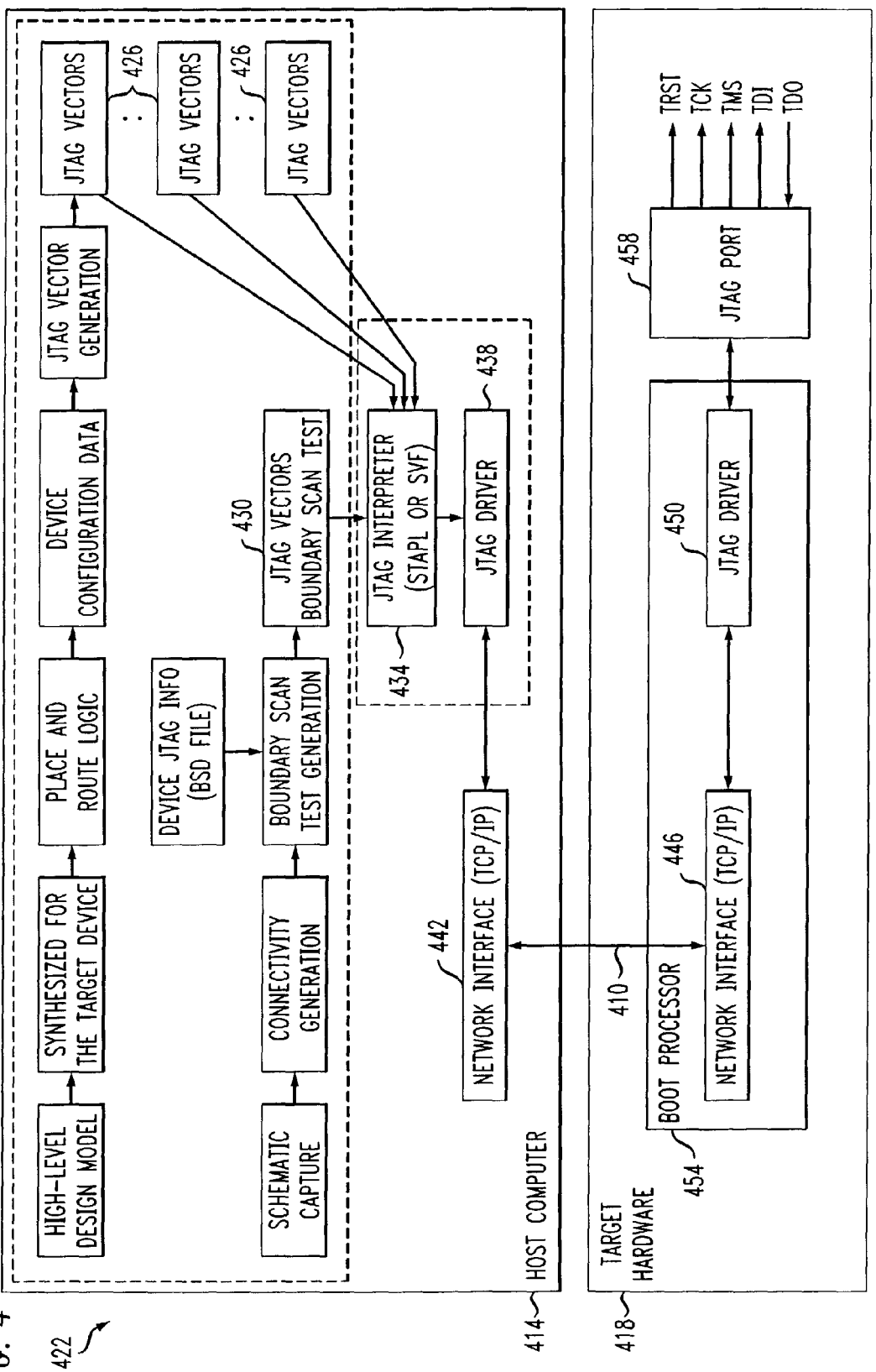
FIG. 4 is a block diagram illustrating a method for remotely programming, configuring, testing and/or verifying devices on a piece of target hardware.

Referring to FIG. 4, a method of remotely accessing JTAG functionality includes using a network link or connection 410 between a host computer 414 and target hardware 418. For example, the host computer 414 is located at a central product development or product service center. The target hardware 418 is located at a remote customer site. The customer site can be, for example, across the state, across the country or around the world from the location of the host computer 414. The network link 410 can be any kind of network link. For example, the network link 410 can be an Ethernet network, a telephone link, or an Internet connection. The host computer 414 provides many of the same development and testing support functions as the host computer 307 of FIG. 3. However, in the system 422 of FIG. 4, device-specific JTAG vectors 426 and boundary scan test vectors 430 are not delivered to automatic test equipment or device programmers. Instead, these files of programming, configuration, verification and/or test information are delivered to a JTAG interpreter 434. The files can be of any mutually understood format. For example, the files can be in a Serial Vector Format (SVF) and/or a Standard Test and Programming Language (STAPL) format which are known in the art. The host computer 414 also includes a host JTAG driver 438 and a host network interface 442. The target hardware 418 includes a target network interface 446 and a target JTAG driver 450. For example, target network interface 446 and target JTAG driver 450 are included in, or associated with, a boot processor 454 of the target hardware 418.

The JTAG interpreter 434 analyzes, and participates in the execution of, instructions found in the files 426, 430 delivered to the JTAG interpreter 434. The instructions in the files can be classified as either JTAG or non-JTAG specific instructions. The JTAG-specific instructions can be performed with six basic actions. Those actions are Instruction Register Data Shift (IRSCAN), Data Register Data Shift, (DRSCAN), Wait Cycle (WCYCLE), Wait Delay (WDELAY), JTAG State Transition (JSTATE), and Application Specific (APPL).

When executed, the IRSCAN command places TAP state machines of devices in a boundary scan chain of the target device into a shift-IR state. In the shift-IR state, data is shifted into an instruction register of the TAP state machines. After the data is shifted, the TAP state machines are placed in an end state.

The DRSCAN command places the TAP state machine into a shift-DR state. During the shift-DR state, data is shifted into data registers of the TAP state machines. When the shifting is completed, the TAP state machines are placed into an end state.

The WCYCLE command places the TAP state machines into a wait state until the TCK signal line is toggled a specified number of cycles.

The WDELAY command also places the TAP state machines into a wait state. In conjunction with the WDELAY command, a timer is loaded with a delay time specified, for example, in microseconds and allowed to run. While the timer is running, no JTAG operations are performed. When the timer expires, JTAG operations are allowed to continue.

The JSTATE command is associated with a predefined state transition table. Parameters associated with the JSTATE command determine a path taken through the table to move the TAP state machines from one stable JTAG state to another.

The APPL command supports application, vendor or device specific commands to allow device-specific control. For example, such device specific commands may be used to initialize I/O pins, reset processors, or initialize control signals that are necessary before performing JTAG operations. The APPL command may also be used to manipulate the TRST signal line since some devices may require the TRST signal in order to properly perform JTAG functions.

Non-JTAG-specific instructions include looping statements and variable manipulations.

Figure 5:
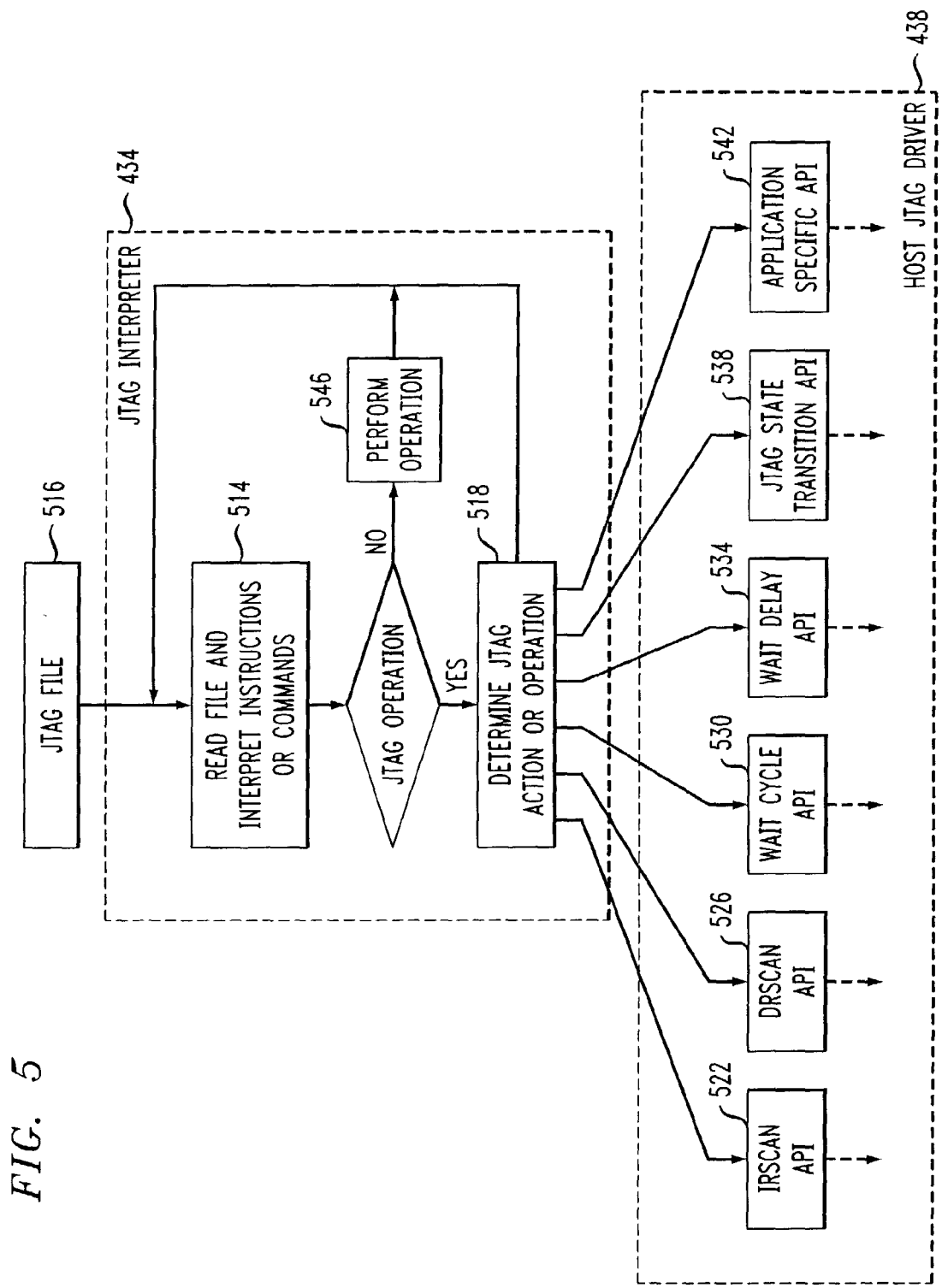
FIG. 5 is a flow chart summarizing the operation of a JTAG interpreter and an interface between the JTAG interpreter and a host JTAG driver.

Referring to FIG. 5, the JTAG interpreter 434 reads 514 input from one or more JTAG design files 516. Information related to JTAG-specific instructions is interpreted and passed to one or more host-side application program interface (API) functions of the host JTAG driver 438. For example, information related to an IRSCAN command is interpreted and passed to an IRSCAN API 522. Information associated with the DRSCAN command is interpreted and passed to a DRSCAN API 526. Information associated with a WCYCLE command is interpreted and passed to a WCYCLE API 530. Information associated with a WDELAY command is interpreted and passed to a WDELAY API 534 Information associated with a JSTATE command is interpreted and passed to a JTAG state transition API 538. Information associated with application-specific commands are interpreted and passed to application-specific APIs 542.

As mentioned above, information read from the JTAG file 516 that is unrelated to JTAG operations, is interpreted and actions or commands associated therewith are performed 546 within the JTAG interpreter 534. For example, loop commands and variable manipulations associated with the calculation of parameters related to the JTAG-specific commands are carried out within the interpreter 534.

Figure 6:
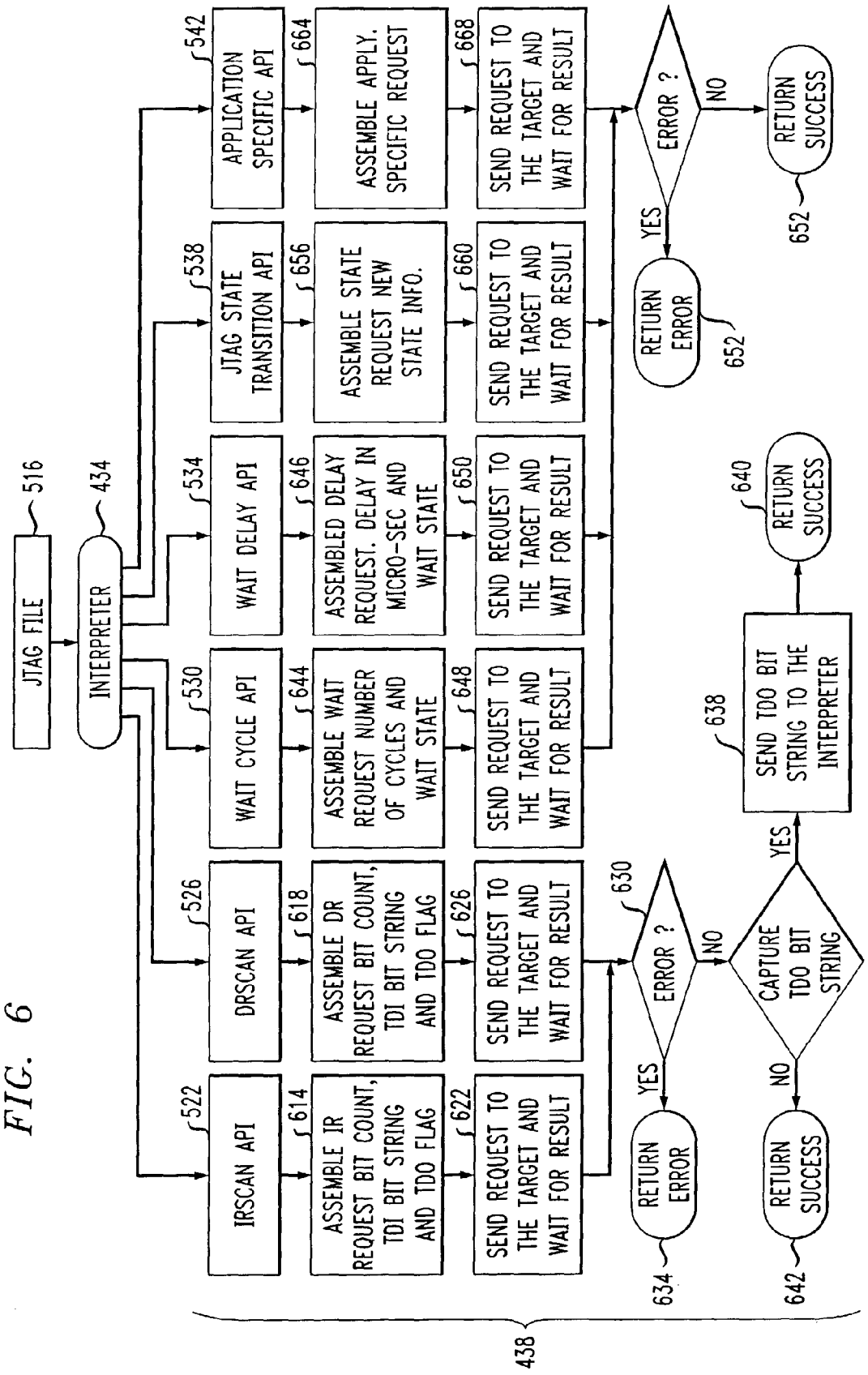
FIG. 6 is a flow chart summarizing the operation of a host JTAG driver.

Referring to FIG. 6, the host side JTAG driver 438 acts as a "client" to the target side JTAG driver 450 (see FIG. 4). The host JTAG driver 438 receives JTAG commands from the interpreter and assembles requests or messages related to the commands and relays them to the target JTAG driver 450. The relaying is accomplished via, for example, TCP-IP messaging, remote procedure calls or by any other interprocess communication scheme. In addition, the host JTAG drive 438 maintains network communication with the target JTAG driver 450. For example, the host JTAG driver 438 receives verification and test results from the target JTAG driver 450. Those results are passed to the interpreter 434. Subsequent interpreter actions are determined, in part, by the returned results. For example, results indicating successful tests allow the interpreter to continue processing the JTAG file 516. Negative, or failure, results may cause the interpreter to retry a previous command.

The IRSCAN and DRSCAN commands are each associated with three arguments. The IRSCAN API 522 and DRSCAN API 526 of the host JTAG driver 450 each assemble 614, 618 messages related to their respective commands or requests, including an indication of a number of bits to be shifted out to the boundary scan chain, a bit string to be shifted out to the boundary scan chain, and a flag to indicate whether an incoming bit string from the boundary scan chain should be captured. The respective messages or requests are sent 622, 626 to the target JTAG driver. The respective APIs 522, 526 wait for the target JTAG driver to return results. When results are received, the results are evaluated 630. If the results indicate an error, an error indication is returned 634 to the interpreter 434. If there is no error, and a bit string was captured, the bit string is returned 638 to the interpreter. An indication of success is also returned 640. If the string wasn't captured, a simple indication of success is returned 642 to the interpreter.

The WCYCLE and the WDELAY commands are each associated with two arguments. The two arguments are a count value and a JTAG state associated with waiting. Therefore, the WCYCLE API and WDELAY API 530, 534 each assemble 644, 646 a message including their respective commands, a count value and an indication of a JTAG state. For the WCYCLE API 530, the count value is indicative of a number of TCK cycles that must occur before the wait period is over. For the WDELAY API 534, the count is a number of microseconds that must transpire before the wait period is terminated. Once assembled, the respective messages are sent 648, 650 to the target JTAG driver. The APIs 530, 534 wait for a result to be returned from the target JTAG driver 450. When the result arrives, it is returned 652 to the interpreter 434.

The JSTATE command takes a single argument, the desired JTAG state. Therefore, the JTAG state transition API assembles 656 a message including the JSTATE command and the desired new state. The message or request is sent 660 to the target JTAG driver 450 and the JTAG state transition API waits for results indicating the success or the failure of the state transition. When the results are received, they are returned 652 to the interpreter 434.

The application-specific API 542 is optional and may or may not be included in the host JTAG driver 438. Additionally, more than one application-specific API may be included in the host JTAG driver. An application-specific API 542 is included when the target hardware 418 includes one or more devices having features or functions requiring or taking advantage of device or vendor-specific JTAG commands. When an application-specific API is included, it, of course, assembles 664 appropriate messages including appropriate commands and associated arguments. The messages are sent 668 to the target JTAG driver 450 and the application-specific API may wait for a result to be received. If a result is received, it is returned 652 to the interpreter 434.

Figure 7:
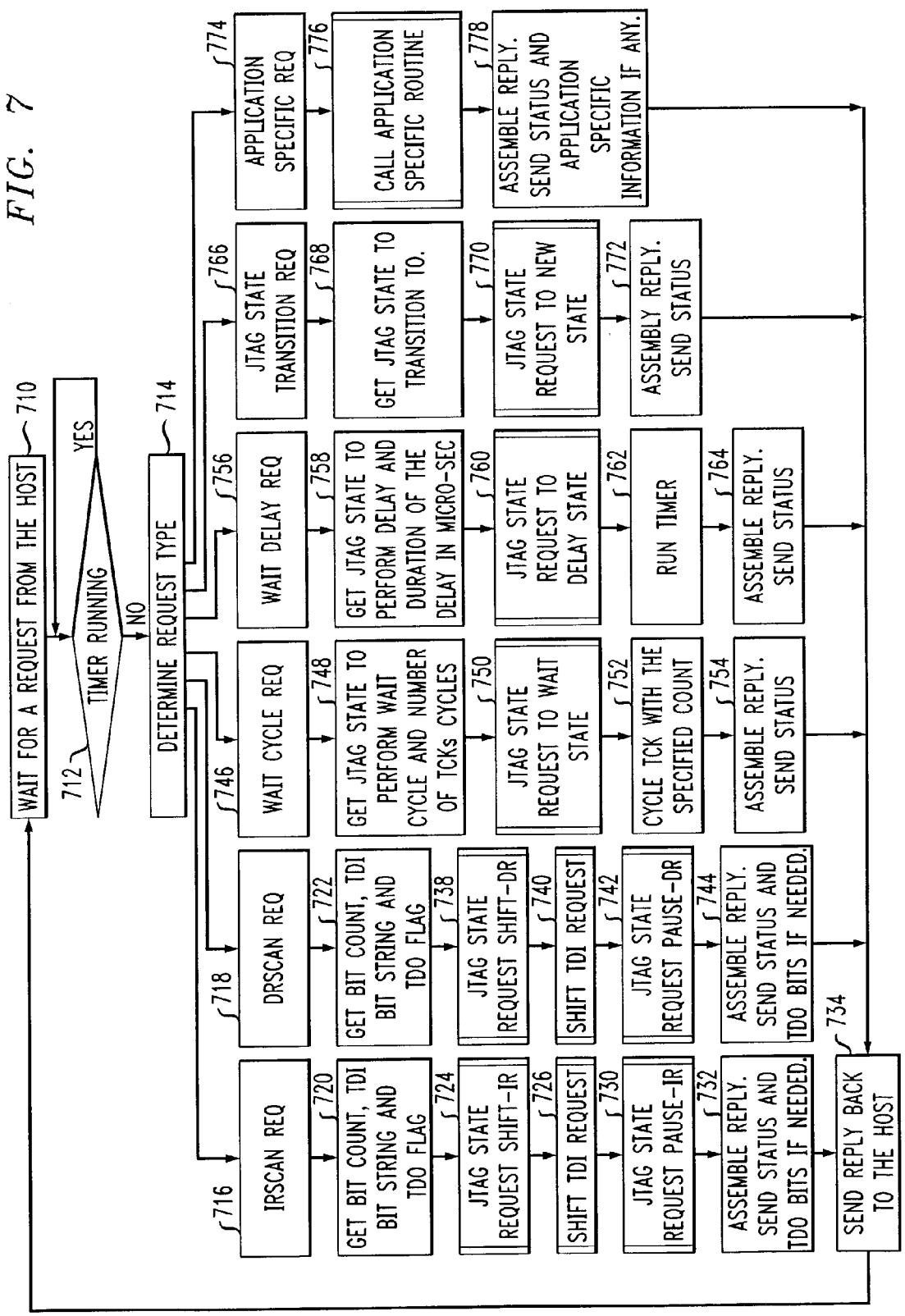
FIG. 7 is a flow chart summarizing the operation of a target JTAG driver.

In the target hardware 418, the target JTAG driver 450 acts as a "server" to the host JTAG driver "client." The target side JTAG driver 450 controls and monitors a physical JTAG port 458 of the target hardware 418. Referring to FIG. 7, the target JTAG driver 450 waits 710 for a request message from the host JTAG driver. When a request is received, the target JTAG driver 450 determines whether request processing should begin immediately or be postponed. For example, the host side driver checks 712 the status of a wait timer. The wait timer may be running, for instance, due to a prior processing of a WDELAY request. If the timer is running, processing of the received request is postponed. If the timer is not running, or when the timer expires, the received request is analyzed 714 and an appropriate function is called.

For example, if the received message is determined 714 to be related to an IRSCAN or DRSCAN request, an IRSCAN 716 or DRSCAN 718 function is called. The functions 716, 718 parse 720, 722 their respective requests into a number of bits to be shifted, a bit string to be shifted out to the TDI signal line, and a flag indicating whether or not a bit string received through the JTAG port 458 is to be captured and returned to the host JTAG driver 438.

The IRSCAN 716 function then controls the JTAG port 458 to place 724 devices (not shown, but similar to devices 114, 218, 246, 250, 254, 258, 262, 310, 314, 334) of the target hardware into a Shift-IR state. The IRSCAN function 716 then controls the JTAG port 458 to issue 726 a Shift-TDI request including the bit string parsed 720 from the received request. When all the bits of the Shift-TDI request have been delivered to the boundary scan chain (not shown, but similar to 118 or 266), the IRSCAN function 716 controls the JTAG port 458 to issue 728 a JTAG Pause-IR state request. IRSCAN 716 function also assembles 732 a reply message to be sent to the host JTAG driver 438. The reply message includes status information. Additionally, the reply message can include the bits captured according to the flag parsed 720 from the received message. The assembled message is sent 734 back to the host JTAG driver 438 through the target network interface 446, network link 410 and host network interface 442.

If the received message is determined 714 to be related to a DRSCAN request, after parsing 722 the message, the DRSCAN function 718 controls the JTAG port 754 so as to issue 738 a Shift-DR state request. Subsequently, the DRSCAN 718 function issues a Shift-TDI request including the bit string parsed 722 from the received message. When all the bits of the Shift-TDI request have been shifted through the boundary scan chain (similar to 118 or 266), the DRSCAN 718 function issues 742 a Pause-DR state request through the JTAG port 458. The DRSCAN function 718 also assembles 744 a reply including status information. Additionally, if bits were captured, in accordance with the flag parsed 722 from the received message, they are included in the assembled 744 reply. The assembled reply is then sent 734 back to the host JTAG driver through the target network interface 446, network link 410 and host network interface 442.

If the received message is related to a WCYCLE request, a WCYCLE function 746 parses 748 the received message and extracts a desired JTAG wait state and a number of TCK cycles the state should be maintained. The WCYCLE function 746 then controls 750 the JTAG port 458 to place the devices on the boundary scan chain (similar to 118 or 266) in the requested wait state. The WCYCLE function 746 then cycles 752 the TCK signal line of the JTAG port 458 the number of cycles determined during the parsing 748. When the cycling is finished, the WCYCLE function 746 assembles 754 a reply message indicating the status of the WCYCLE request. The reply message is then sent 734 back to the host JTAG driver 438 as described above.

If the received message is determined 714 to be related to a wait delay request (WDELAY), a wait delay function 756 parses 758 the message into a desired JTAG wait state and a number of microseconds it is desired to remain in the requested wait state. The wait delay function 756 controls 760 the JTAG port 458 to request the desired delay state. The wait delay function 756 also loads a timer (see 712) with a delay time (for example, in microseconds) and starts the timer running 752. When the timer is started, a reply message is assembled 764 indicating the status of the wait delay request. The assembled reply is sent 734 back to the host JTAG driver as described above.

If the received message is determined 714 to be related to a JTAG state transition request, a JTAG state transition function 766 determines 768 the desired JTAG state indicated by the message and controls 770 the JTAG port 458 to request a transition to the desired JTAG state. When the JTAG state transition is completed, a reply message is assembled 772 indicating the status of the transition. The message is sent 734 back to the host JTAG driver as described above.

If the received message is determined 714 to be an application-specific request, for example, related to a device or vendor-specific expanded JTAG function, then an associated application-specific function 744 parses 776 the message into whatever arguments are associated with the application-specific message. The JTAG port 454 is controlled 776 so as to issue the application-specific request to the associated devices. Where appropriate, a reply message is assembled 778 including status and any application-specific information that may be required. The reply message is then sent 734 back to the host JTAG driver 438 as described above.

A plurality of target JTAG driver functions 716, 718, 746, 756, 766 request JTAG state changes 724, 738, 750, 760, 770, 730, 742. Therefore, a JTAG state routine 780 is used to control the JTAG port 454 as needed by each of the target JTAG driver functions 716, 718, 746, 756, 766. The JTAG state routine 780 determines 782 a current state of the devices on the boundary scan chain of the target hardware 418 and consults a JTAG state transition table 784 to determine a transition path from the current state to the desired state. The JTAG state routine 780 then controls 786 the JTAG port 458 in order to achieve the path of transitions indicated by the JTAG state transition table 784. Processing is then returned 788 to the appropriate target JTAG driver function 716, 718, 746, 756, 766.

The IRSCAN request 716 and DRSCAN request 718 functions shift data out to the TDI signal line of the boundary scan chain of the target hardware 418. The shifting can be achieved with a Shift TDI routine 790. The Shift TDI routine 790 examines the data capture flag parsed 720, 722 from the received message. If the flag so indicates, the Shift TDI routine 790 shifts bits out to the TDI signal line and stores 794 captured bits received from the TDO signal line. If the flag indicates that capturing bits from the TDO line is not required, the Shift TDI routine 790 simply shifts 796 bits out to the TDI line. When the shifting is completed, processing returns 798 to the appropriate function 716, 718.

Embodiments implemented as described above generate at least two network transmissions for each JTAG operation. Each operation generates a request from the host side driver 438 to the target side driver 450 over the network link 410. Additionally, the target side driver 450 generates a reply message which is sent to the host side driver 438 back over the network link 410. This technique carries with it a great deal of network overhead. For example, each operation request or reply message is packaged along with addressing and error detecting and/or correction information and transmitted by the associated network interface 442, 446.

However, it is not necessary to transmit individual JTAG operation requests and reply messages. Instead, a plurality of operations can be placed in a queue and transmitted as a block. For example, JTAG operation requests can be queued until a request is encountered that requires the capture and return of data bits from the TDO signal line of a boundary scan chain.

Figure 8:
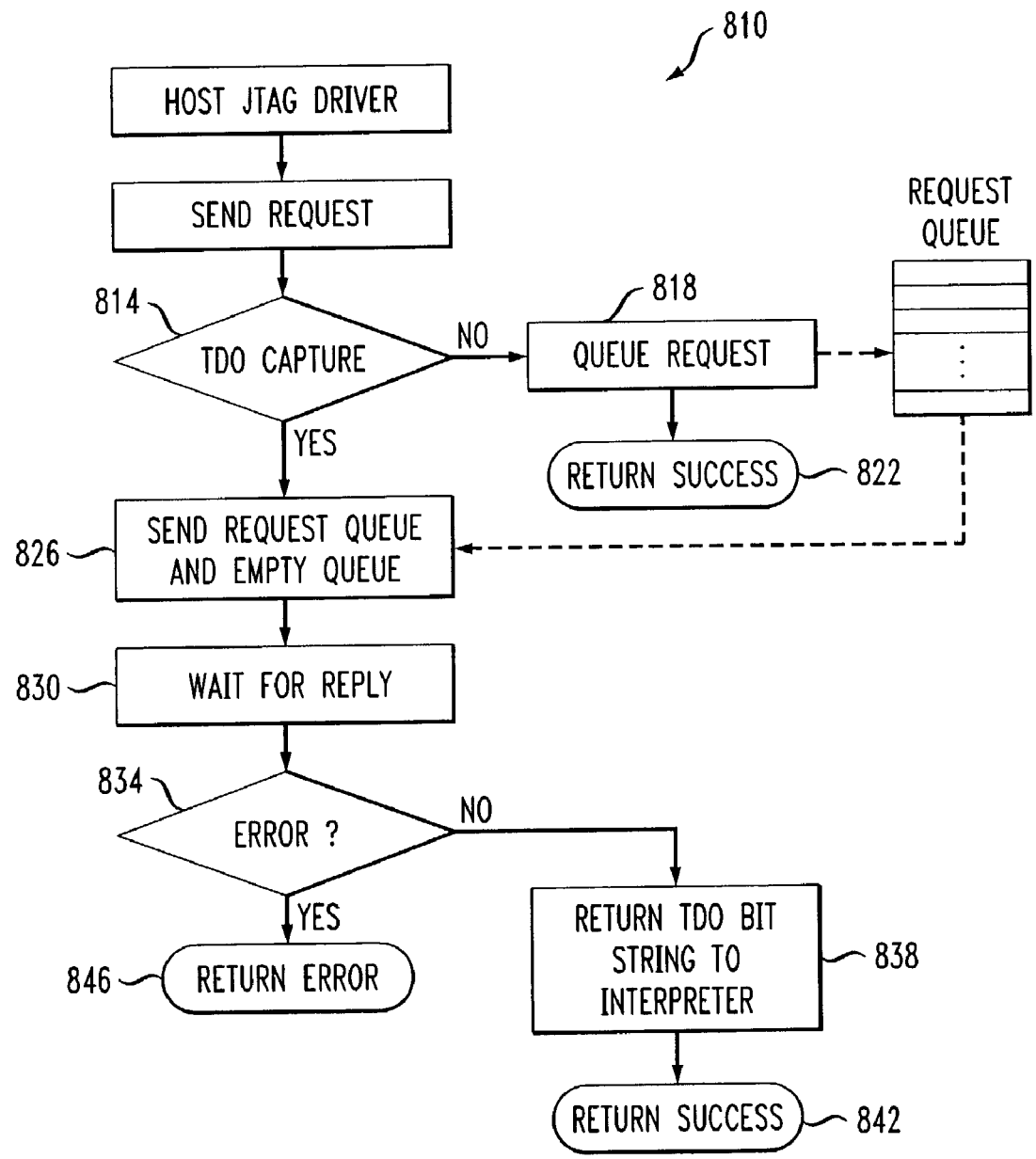
FIG. 8 is a flow chart summarizing the operation of a queuing method associated with a host JTAG driver.

For instance, referring to FIG. 8, a host side queuing routine 810 examines 814 JTAG operation requests received from the interpreter 434. If the requested operation does not require bits to be captured from the TDO signal line of the boundary scan chain, the request is queued 818. Where portions of the host JTAG driver expect prompt reply messages indicating the success of the requested operation, a false success message may be returned 822 to the host side driver from the host side queuing routine 810. If the examined JTAG operation request does require data captured from the TDO line to be returned to the host side driver 438, then the information in the queue transmitted along with the examined JTAG operation request requiring a reply including TDO information and the queue is emptied 826. The host side JTAG driver then waits 830 for a reply. When the reply is received, the reply is examined 834. If the operation did not generate an error, the TDO bit string is returned 838 to the interpreter. Additionally, an indication of success may also be returned 842. If one or more of the transmitted operations fails, an indication of the error is returned 846 to the interpreter 434. Transmitting a plurality of JTAG operation requests as a block reduces network overhead because addressing and error checking and/or correcting information is applied to the block and not to each of the individual operation requests.

Figure 9:
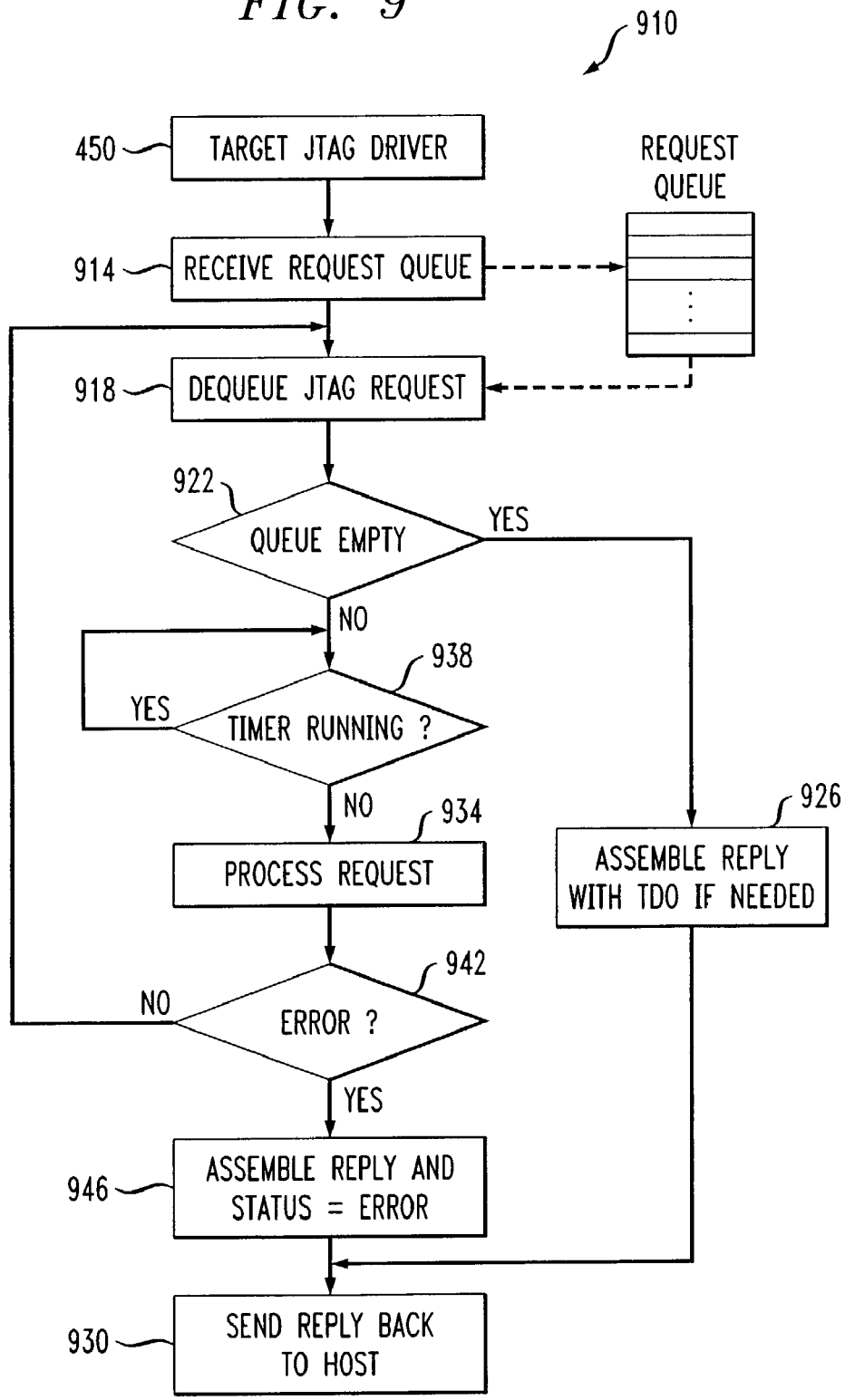
FIG. 9 is a flow chart illustrating the receiving and de-queuing of a block of messages received by a target JTAG driver.

Referring to FIG. 9, when JTAG operation requests are transmitted in a block, they can be received faster than the target JTAG driver 450 can process them. Therefore, a method for buffering 910 received JTAG operation requests includes storing 914 the received requests in a queue and de-queuing 918, the requests as system resources allow. The queue is monitored 922 to determine if it contains unprocessed requests. When the queue is empty, a reply is assembled 926 based on, for example, the last processed request. The assembled reply is sent 930 back to the host. If the queue isn't empty, the next available request is processed 934 in a manner similar to that described above in reference to FIG. 7. As described above, the status of the delay timer is checked 938 before a request is processed 934. If the timer is running, then processing 934 is delayed until the timer expires. If the processing 934 is successful, then the next available request is de-queued 918. If error checking 942 determines that the processing 934 generated an error, a reply message is generated 946 indicating the error. The reply message is then sent 930 back to the host.

The invention has been described with reference to particular embodiments. Modifications and alterations will occur to others upon reading and understanding the specification. It is intended that all such modifications and alterations are included insofar as they come within the scope of the appended claims or equivalents thereof.

What is claimed is:

1. A system for remotely controlling a test port of a target device, the system comprising:
   a network link;
   a host computer including:
      a host network interface operative to connect the host computer to the network link;
      an interpreter operative to translate a design file into commands;
      a host driver operative to assemble at least one message based on the commands, deliver the at least one message to the host network interface, receive results from the host network interface, and pass the results received from the host network interface back to the host interpreter and wherein the host driver includes an instruction queue and means for queuing instructions in the queue until an instruction requiring a reply is included in the queue;
   the target device including:
      a target network interface operative to connect the target device with the network link; and
      a target driver operative to receive messages from the target network interface, translate the at least one message into an operation, operate the test port in accordance with the operation, receive results from at least one device in communication with the port and deliver the results to the target network interface, for transmission to the host network interface and wherein the target driver includes a means for receiving, buffering and processing a plurality of instructions received in a batch from the host.

2. The system of claim 1 wherein the network link comprises an Ethernet link.

3. The system of claim 2 wherein the network link further comprises a TCP/IP protocol.

4. The system of claim 1 wherein the host computer further comprises means for generating vectors for configuring or testing a component of the target device.

5. The system of claim 1 wherein the host computer further comprises means for generating vectors for defining or testing interconnections between components of the target device.

6. The system of claim 1 wherein the interpreter is operative to translate a serial vector format design file.

7. The system of claim 1 wherein the interpreter is operative to translate a standard test and programming language format design file.

8. The system of claim 1 wherein the host driver comprises a plurality of application program interface functions, each application program interface function being operative to receive one or more arguments from the interpreter and assemble a message from the arguments.

9. The system of claim 1 wherein the means for queuing instructions further comprises means for generating and returning false success messages indicating the success of a requested operation where a portion of the host driver expects prompt reply messages.

10. A method of remotely controlling a test port of target hardware comprising:
providing a target network interface on the target hardware;
providing a network link between the target network interface and a host computer;
providing a target driver on the target hardware in communication with the target network interface;
translating at least one operation or action into a plurality of commands in the host computer;
placing commands of the plurality in a queue until a command is placed into the queue that requires a result:
assembling a network compatible data packet containing the commands from the queue;
transmitting the network compatible data packet to the target network interface over the network link;
reconstructing the commands from the queue from the network compatible data packet on the target hardware;
interpreting the reconstructed commands into a plurality of operations; and,
controlling the test port of the target hardware based on the plurality of operations, thereby generating the required result.

11. The method of remotely controlling a test access port of claim 10 further comprising:
receiving a result in the target driver from the test port;
delivering the result to the target network interface;
assembling a network compatible result packet based on the delivered result;
transmitting the network compatible data packet to the host over the network link;
reconstructing the result from the network compatible result packet; and,
processing the result.

12. The method of remotely controlling a test port of claim 10 wherein providing a network link between the target network interface and the host computer comprises providing an Ethernet link between the target network interface and the host computer.

13. The method of remotely controlling a test access port of claim 12 wherein providing an Ethernet link between the target network interface and the host computer further comprises providing a TCP/IP protocol.

14. An electronic apparatus including at least one JTAG compliant device, the electronic device adapted to allow for the JTAG compliant devices and/or interconnections associated therewith, to be at least one of remotely programmed, configured, verified and tested, the electronic apparatus comprising:
a JTAG boundary scan chain including the at least one JTAG compliant device;
a network interface operative to receive a packet including a plurality of JTAG messages and transmit a JTAG message over a network; and,
a JTAG driver operative to receive the plurality of JTAG messages from the network interface, control the boundary scan chain based on the received plurality of JTAG messages, and to deliver boundary scan results to the network interface for transmission as the JTAG message, wherein only one of the JTAG messages in the packet requires a reply.

15. A system for remotely controlling a test access port of a target device, the system comprising:
a network link;
a host computer including:
a host network interface operative to connect the host computer to the network link;
a JTAG interpreter operative to translate a JTAG design file into commands;
a host JTAG driver operative to assemble at least one JTAG message based on the JTAG commands, deliver the at least one JTAG message to the host network interface, receive results from the host network interface, and pass the results received from the host network interface back to the host JTAG interpreter and wherein the host JTAG driver includes an instruction queue and means for queuing instructions in the queue until an instruction requiring a reply is included in the queue;
the target device including:
a target network interface operative to connect the target device with the network link; and
a target JTAG driver operative to receive JTAG messages from the target network interface, translate the at least one JTAG message into a boundary scan operation, operate a JTAG port in accordance with the boundary scan operation, receive results from the boundary scan chain and deliver the boundary scan chain results to the target network interface, for transmission to the host network interface and wherein the target JTAG driver includes a means for receiving, buffering and processing a plurality of instructions received in a batch from the host.

16. The system of claim 15 wherein the network link comprises an Ethernet link.

17. The system of claim 16 wherein the network link further comprises a TCP/IP protocol.

18. The system of claim 15 wherein the host computer further comprises means for generating JTAG vectors for configuring or testing a component of the target device.

19. The system of claim 15 wherein the host computer further comprises means for generating JTAG vectors for defining or testing interconnections between components of the target device.

20. The system of claim 15 wherein the JTAG interpreter is operative to translate a serial vector format design file.

21. The system of claim 15 wherein the JTAG interpreter is operative to translate a standard test and programming language format design file.

22. The system of claim 15 wherein the host JTAG Driver comprises a plurality of application program interface functions, each application program interface function being operative to receive one or more arguments from the JTAG interpreter and assemble a JTAG message from the arguments.

23. The system of claim 15 wherein the means for queuing instructions further comprises means for generating and returning false success messages indicating the success of a requested operation where a portion of the host driver expects prompt reply messages.

24. A method of remotely controlling a test access port of target hardware comprising:
   providing a target network interface on the target hardware;
   providing a network link between the target network interface and a host computer;
   providing a target JTAG driver on the target hardware in communication with the target network interface;
   translating at least one JTAG operation or action into a plurality of commands in the host computer;
   placing commands of the plurality in a queue until a command is placed into the queue that requires a result;
   assembling a network compatible data packet containing the commands from the queue;
   transmitting the network compatible data packet to the target network interface over the network link;
   reconstructing the commands from the queue from the network compatible data packet on the target hardware;
   interpreting the reconstructed commands into a plurality of boundary scan operations; and,
   controlling the test access port of the target hardware based on the boundary scan operations, thereby generating the required result.

25. The method of remotely controlling a test access port of claim 24 further comprising:
   receiving a result in the target JTAG driver from the test access port;
   delivering the result to the target network interface;
   assembling a network compatible result packet based on the delivered result;
   transmitting the network compatible data packet to the host over the network link;
   reconstructing the result from the network compatible result packet; and,
   processing the result.

26. The method of remotely controlling a test access port of claim 24 wherein providing a network link between the target network interface and the host computer comprises providing an Ethernet link between the target network interface and the host computer.

27. The method of remotely controlling a test access port of claim 26 wherein providing an Ethernet link between the target network interface and the host computer further comprises providing a TCP/IP protocol.

* * * * *